US006939435B1

(12) United States Patent
Tanaka et al.

(10) Patent No.: US 6,939,435 B1
(45) Date of Patent: Sep. 6, 2005

(54) PLASMA PROCESSING APPARATUS AND PROCESSING METHOD

(75) Inventors: Junichi Tanaka, Hachioji (JP); Hiroyuki Kitsunai, Ibaraki-ken (JP); Hideyuki Yamamoto, Kudamatsu (JP); Shoji Ikuhara, Hikari (JP); Akira Kagoshima, Kudamatsu (JP)

(73) Assignees: Hitachi, Ltd., Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/875,213

(22) Filed: Jun. 25, 2004

(30) Foreign Application Priority Data

Feb. 27, 2004 (JP) .............................. 2004-054229

(51) Int. Cl.7 ...................... H01L 21/306; H01L 21/26
(52) U.S. Cl. ................... 156/345.35; 438/798
(58) Field of Search ................. 438/789, 200, 438/798, 715, 710; 216/63, 60, 59, 69; 156/345.24, 156/345.46, 345.35, 345.27

(56) References Cited

U.S. PATENT DOCUMENTS

| 6,214,162 B1 * | 4/2001 | Koshimizu ............. 156/345.28 |
| 2003/0052086 A1 * | 3/2003 | Mizumura et al. ............ 216/63 |

FOREIGN PATENT DOCUMENTS

| JP | 08-085885 | 4/1996 |
| JP | 2003-173976 | 6/2003 |
| JP | 2003-518328 | 6/2003 |
| JP | 2003-243362 | 8/2003 |
| JP | 2003-309106 | 10/2003 |
| WO | WO 01/45490 | 6/2001 |

* cited by examiner

Primary Examiner—Craig A. Thompson
Assistant Examiner—Monica D Harrison
(74) Attorney, Agent, or Firm—Antonelli, Terry, Stout & Kraus, LLP

(57) ABSTRACT

The present invention provides a plasma processing apparatus and processing method capable of maintaining a constant processing profile. The plasma processing apparatus for providing a plasma processing to a wafer placed in a processing chamber comprises a processing vessel 1a constituting the processing chamber 1, process gas supply devices 3, 4 for supplying processing gas to the processing chamber 1, and a plasma generating means 2 for generating plasma by supplying electromagnetic energy to the processing chamber and dissociating the process gas supplied to the processing chamber, wherein the apparatus further comprises a processing chamber surface temperature control unit 15 for controlling the inner surface temperature of the processing chamber, the control unit controlling the temperature by heating the inner surface of the processing chamber by generating plasma in the chamber for a predetermined processing time based on a processing history after terminating a cleaning process and prior to performing the wafer processing.

16 Claims, 13 Drawing Sheets

PLASMA PROCESSING APPARATUS AND PROCESSING METHOD

The present application claims priority from Japanese patent application No. 2004-54229 filed on Feb. 27, 2004, the content of which is hereby incorporated by reference into this application.

FIELD OF THE INVENTION

The present invention relates to a plasma processing apparatus and processing method, and more specifically, to a plasma processing apparatus and processing method preferably applied to the micromachining of semiconductor devices.

DESCRIPTION OF THE RELATED ART

A plasma processing apparatus is a device for forming fine patterns on a surface of a wafer to be fabricated into a semiconductor device or the like. One typical example of the plasma processing apparatus is a plasma etching apparatus. The plasma etching apparatus is equipped with a processing chamber for processing the wafer, a sample stage for placing the wafer disposed in the processing chamber, and a gas supply system including, for example, a shower plate for introducing the gas used for etching reaction into the processing chamber. The apparatus is further equipped with a gas exhaust system including, for example, a discharge pump and a pressure regulating valve for keeping the interior of the processing chamber to reduced pressure and maintaining a stable plasma discharge.

Further, the plasma processing apparatus is equipped with a plasma generating mechanism for supplying electromagnetic energy such as microwaves and RF waves to the processing chamber so as to generate plasma from the etching gas supplied to the processing chamber, and a bias voltage application mechanism for applying bias voltage to the sample stage so as to accelerate the ions in the plasma toward the wafer placed on the sample stage.

The ions accelerated toward the wafer bombard the wafer from a direction perpendicular to the wafer, and thus, the direction of ion irradiation is regulated. The surface of the wafer that is not covered with a mask is etched perpendicularly, and thus, anisotropic etching is carried out in which microscopic patterns having perpendicular side walls are formed on the wafer surface. Further, the etching reaction is not only carried out by ions. For example, the electrons in the plasma activate the etching gas and generate reactive species called radicals, and this reaction species cause chemical reaction to occur at the wafer surface that has been energized by ions, thereby accelerating the etching reaction.

The dimensions of semiconductor devices have become refined year after year, along with which the processing accuracy required when processing wafers in the plasma processing apparatuses have become more demanding. On the other hand, the processing profile achieved by processing wafers in a plasma processing apparatus fluctuates by the state of plasma and radicals in the processing chamber. Therefore, in order to continuously carry out uniform processing with an accuracy in the order of a few nanometers during repeated processing of wafers, it is necessary to maintain the states of plasma and radicals as constant as possible.

The reaction products and radicals generated during etching of the wafers can be discharged through the exhaust system. However, the reaction products will gradually deposit in the processing chamber during repeated wafer processing, and cause the state of the inner surface of the processing chamber (the surface of the processing chamber exposed to plasma and radicals, and the surface of components disposed in the processing chamber) to change.

The states of the plasma and radicals contained in the processing chamber are easily affected by the surface state of the processing chamber, and therefore, the processing profiles of the semiconductor devices gradually vary during repeated etching even under the same processing conditions, causing the performance of the semiconductor devices to deteriorate. Not only the change of surface state of the processing chamber body but also the change of surface state of the components in the chamber such as the sample stage or the shower plate exposed to plasma and radicals may cause the state of plasma and radicals to fluctuate.

If the deposits in the processing chamber are left unremoved, the thickness of the deposits increases gradually, and the repeated thermal stress of plasma heating causes the thick deposits to crack and create fine contaminants. If the contaminants fall on the wafers, they obstruct the etching process and cause process defects that lead to malfunction of the processed devices.

The changes of surface conditions of the processing chamber etc. are not only caused by deposits. If oxygen gas is used as one of the etching gases, it causes the processing chamber surface to oxidize, and if halogen gas is used, it causes the surface to be halogenated. Further, if the inner surface of the processing chamber is exposed to vacuum without being used for a long period of time, the surface state may change, for example, by the vaporization of a portion of the chemical substances that constitute the inner surface of the chamber.

In the prior art, plasma cleaning was carried out in an attempt to solve the above-mentioned problems by removing the deposits in the processing chamber using plasma. Another conventional countermeasure was to increase the temperature of the inner wall of the processing chamber so as to suppress the deposition of reaction products to the inner surface of the chamber. However, most of these measures were not sufficient, and the processing profiles of the semiconductor devices were still gradually varied. Therefore, it was necessary to replace or to clean the components of the processing apparatus before the fluctuation of the processing profiles caused problems.

Patent document 1 discloses one example of plasma cleaning in which rapid cleaning is performed by reversing the current flow direction of at least one of a plural solenoid coils constituting a plasma processing apparatus. Patent document 2 discloses a method for cleaning a plasma processing apparatus that is used for processing nonvolatile members, capable of suppressing the deposition of reaction products to the inner wall of the vacuum vessel and removing the deposited reaction products efficiently. Further, patent document 3 discloses performing plasma cleaning for a plasma generating chamber using O2 gas etc. whenever a sample is processed using plasma. Patent document 4 discloses a method for suppressing the deposition of reaction products on a shower plate having many bores that allow gas to be supplied into the processing chamber, by controlling the temperature of the shower plate via a temperature controller disposed outside the processing chamber. Patent document 5 discloses carrying out plasma cleaning via in-situ cleaning, and thereafter, redepositing a polymer coating to the surface of the processing chamber to stabilize the etching process.

Patent document 1:
  Japanese Patent Application Laid-Open 2003-173976
Patent document 2:
  Japanese Patent Application Laid-Open 2003-243362
Patent document 3:
  Japanese Patent No. 3404434
Patent document 4:
  Japanese Patent Application Laid-Open 2003-309106
Patent document 5:
  Published Japanese Translation of PCT Patent Application No. 2003-518328

The apparatuses disclosed in patent documents 1, 2 and 3 are capable of removing the deposits in the processing chamber. However, they are not capable of suppressing the fluctuation of processing profiles of the wafers. This is because the composition of the processing gas used for removing the deposits differ from the composition of the gas used for etching the wafers. Thus, it is difficult to maintain a constant plasma and radical state and to maintain a fixed processing profile just by removing the deposits in the processing chamber.

According to the apparatus disclosed in patent document 5, the etching process is stabilized by providing a polymer coating to the inner surface of the processing chamber after carrying out plasma cleaning. However, the state of radicals cannot be made constant simply by coating the inner surface of the processing chamber with polymer. This is because the state of surface reaction may change according to the temperature of the inner walls of the processing chamber.

Patent document 4 provides means for adjusting the temperature of the shower plate by heating the same. However, when the temperature of the shower plate is controlled from outside, the surface of the shower plate being exposed to plasma is heated by the ions in the plasma. Therefore, the temperature of the surface exposed to plasma rises compared to the other portions. Thus, it is difficult to uniformly control the surface temperature thereof which has the greatest influence on surface reaction.

Especially when quarts or other material having low thermal conductivity is used to form components, the temperature of the inner surface of the quarts-made component exposed to plasma and that of the outer surface exposed to the heating means may differ greatly. In other words, the inner surface temperature of the processing chamber maybe left substantially uncontrolled, and this may cause the fluctuation of the radical state.

SUMMARY OF THE INVENTION

In view of the above-mentioned problems, the present invention offers a plasma processing apparatus and processing method capable of maintaining a constant processing profile.

In order to solve the problems, the present invention provides the following solution.

A plasma processing apparatus for providing a plasma processing to a wafer transferred into a vacuum processing vessel comprses: a vacuum processing vessel constituting a vacuum processing chamber; a processing gas supply unit for supplying a processing gas to the vacuum processing vessel; a plasma generating means for generating plasma by supplying electromagnetic energy to the vacuum processing vessel and dissociating the processing gas supplied to the processing chamber; a means for heating or cooling the vacuum processing vessel; and a processing chamber surface temperature control unit for controlling the inner surface temperature of the vacuum processing chamber, wherein the control unit controls the inner surface temperature by generating plasma in the processing chamber based on processing conditions set in advance according to a processing history so as to heat the inner surface of the processing chamber, after terminating a cleaning process and prior to performing the wafer processing.

The present invention provides a plasma processing apparatus and processing method having the above-mentioned structure that is capable of maintaining a constant processing profile.

DETAILED DESCRIPTION OF THE PREFERRED EMBODIMENT

Figure 1:
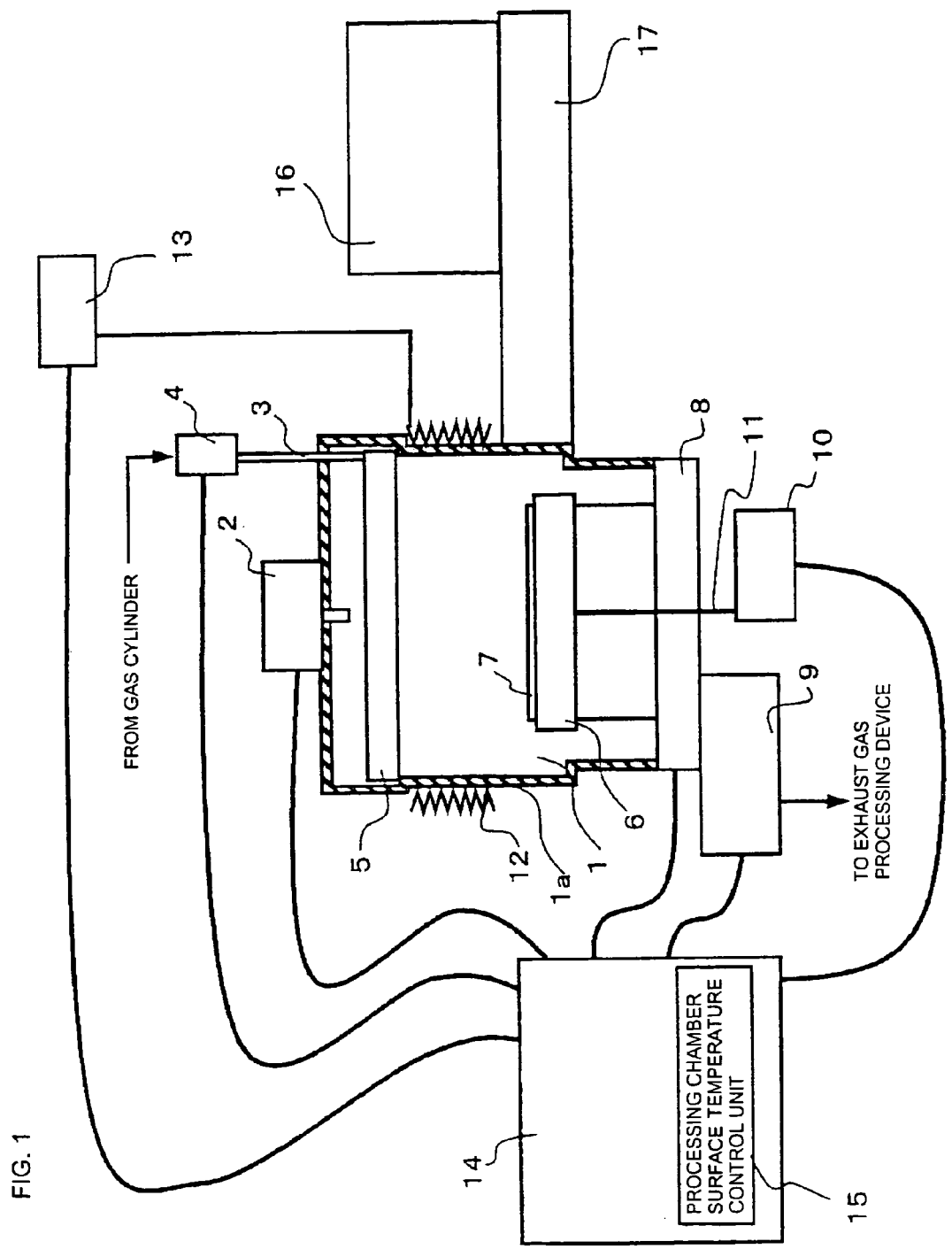
FIG. 1 is an explanatory view illustrating a plasma processing apparatus according to a preferred embodiment of the present invention.

Now, the preferred embodiments of the present invention will be explained with reference to the accompanying drawings. FIG. 1 illustrates a plasma processing apparatus according to a first embodiment of the present invention. As shown in the drawing, the plasma processing apparatus comprises a processing vessel 1, a sample stage 6 disposed in the processing vessel 1 for placing a wafer 7, and a gas supply system for introducing the gas required for carrying out etching reaction into the processing chamber. The gas supply system includes, for example, a shower plate 5 through which gas is introduced into the processing chamber, a gas supply pipe 3 for supplying gas to the shower plate 5, and a flow controller 4 for controlling the gas flow. Further, the plasma processing apparatus includes a gas exhaust system 9 and a pressure regulating valve 8, through which the pressure chamber is maintained at a low pressure condition enabling plasma discharge to be stably maintained.

Furthermore, the plasma processing apparatus comprises an electromagnetic energy supply means 2 for supplying microwaves or RF waves into the processing chamber in order to generate plasma from the etching gas maintained at low pressure in the processing chamber. The apparatus further comprises a bias power supply 10 and a bias power transmission line 11 through which bias voltage is applied to the sample stage 6 to attract and accelerate the ions in the plasma toward the wafer 7 placed on the sample stage 6.

The plasma processing apparatus further comprises a temperature regulator (such as a heater) 12 and a temperature regulating power supply 13 for regulating the wall temperature of the processing chamber by heating or cooling. It further comprises a system control unit 14 for controlling each of the above-mentioned means. The system control unit 14 is equipped with a processing chamber surface temperature control unit 15 for controlling the surface temperature of the processing chamber. Furthermore, the apparatus is equipped with a wafer transfer unit 17 for transferring the wafer into the processing vessel 1 from a cassette 16 capable of housing plural wafers.

Figure 2:
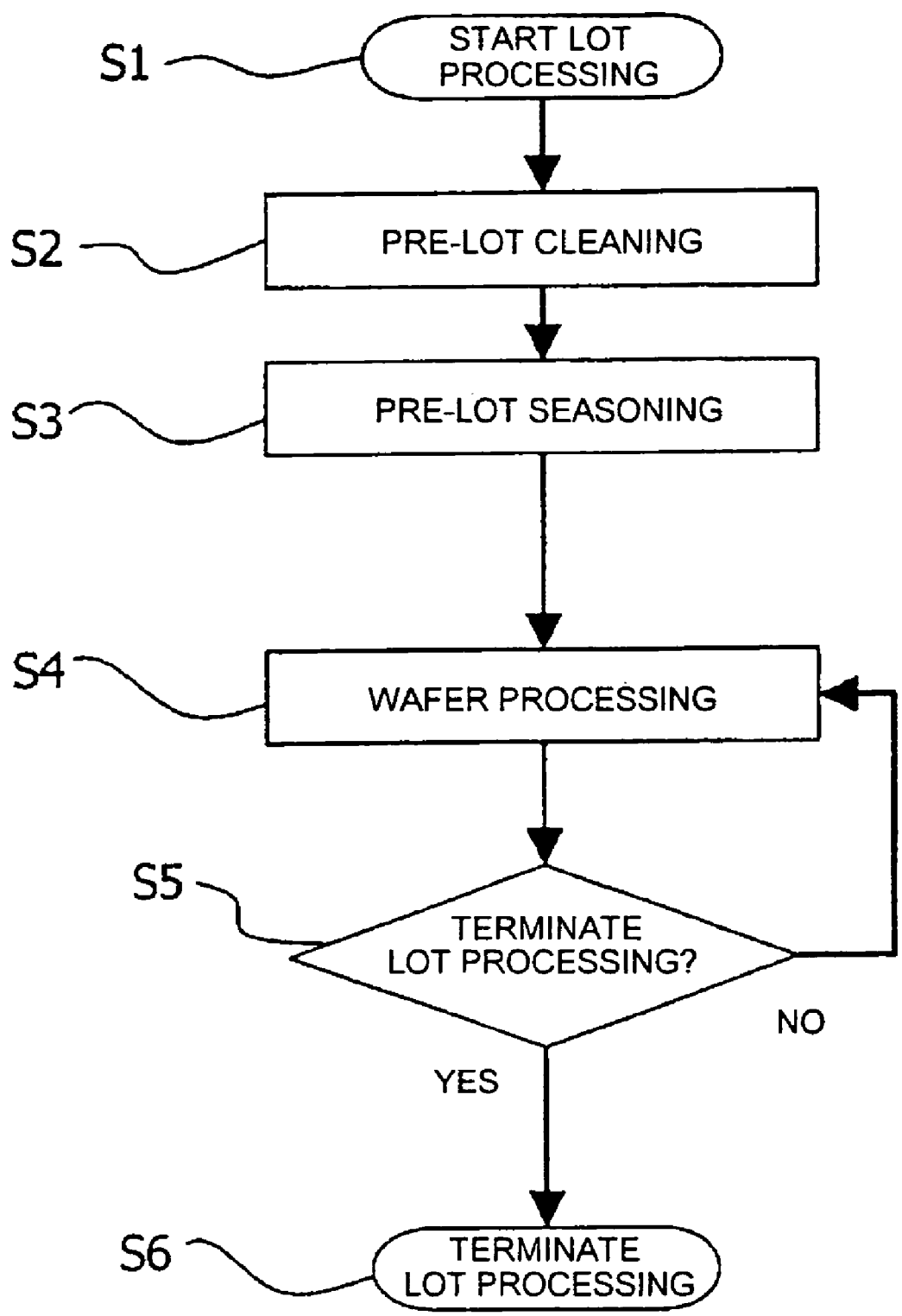
FIG. 2 is a diagram showing the continuous lot processing.

FIG. 2 is a view explaining the continuous processing of a single lot of wafers (a group of plural wafers to be fabricated into a semiconductor device of the same type is called a "lot", and the process for continuously processing a lot of wafers housed in a cassette when carrying out wafer processing is called continuous lot processing. This process enables the amount of processing per unit time to be increased.).

Lot processing is started in step S1, a pre-lot cleaning is carried out in step S2 for cleaning the processing chamber, and when the pre-lot cleaning step S2 is terminated, a pre-lot seasoning is carried out in step S3 for allowing the processing chamber wall to adapt to the gas used for wafer processing.

Thereafter, a wafer processing step S4 for continuously processing the wafers in the lot is carried out repeatedly until the termination of the processing of wafers in the lot is detected in step S5.

Figure 3:
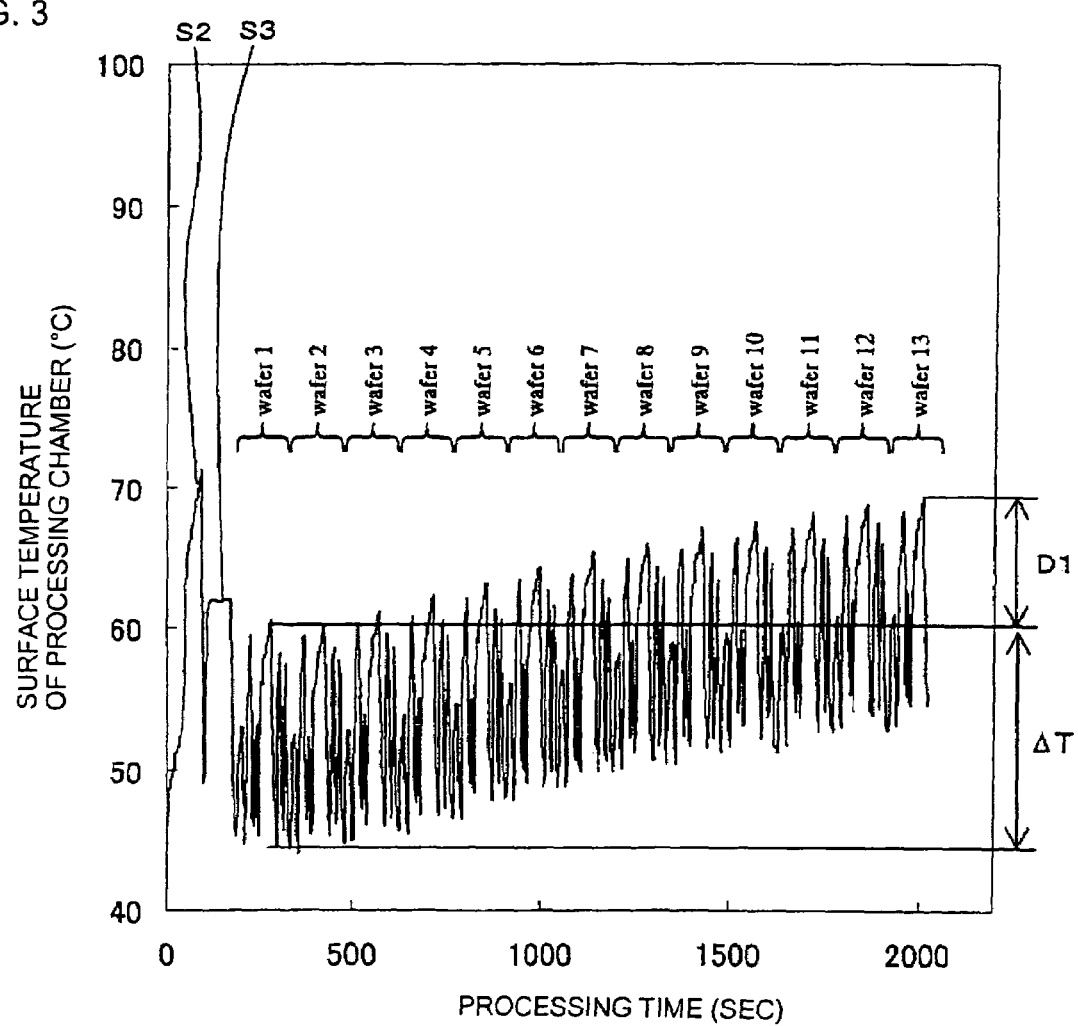
FIG. 3 is a chart illustrating the change of surface temperature of the processing chamber during lot processing.

FIG. 3 illustrates the change in surface temperature of the processing chamber during lot processing. The processing vessel 1 is constantly heated by a temperature regulator 12. When plasma is turned on (that is, when plasma is generated in the processing chamber), the ions become incident on the inner surface of the processing chamber and heat the inner surface, so the inner surface temperature of the processing chamber is not constant. For example, the processing of a single wafer comprises plural processing steps in which the processing conditions such as gas species or pressure differ, and plasma may be turned off during the plural processing steps.

In such case, despite the temperature regulation performed via the heater 12, the inner surface temperature of the processing chamber rises when plasma is turned on, and falls when plasma is turned off. As described, the temperature repeatedly rises and falls during processing of a single wafer, and fluctuates within a certain range shown by $\Delta T$ in FIG. 3.

The fluctuation range of the temperature during a single wafer processing should preferably be the same for all the wafers so as to suppress the change in processed profile. However, if there is a long idle time between the processing of a previous lot and the starting of processing of a current lot (idle time between lots) in the processing chamber 1, the processing chamber 1 is cooled even by the heating performed by the temperature regulator 12 since plasma heating is not performed. Therefore, as shown in FIG. 3, the temperature of the inner surface of the processing chamber rises a long with the repeated wafer processing, and drifting of temperature shown by D1 in FIG. 3 occurs between wafers.

Such temperature drift D1 is not preferable since it causes variation of processing profile. The drop of processing chamber temperature due to the idle time between lots occurs even when the idle time is as short as approximately ten minutes. Further, the processing chamber is cooled even when plural lots are processed continuously without any idle time. For example, the cooling occurs when processing a lot requiring a large processing power directly after processing a lot requiring a very small processing power. This is because when a lot requiring a small processing power is processed, the surface of the processing chamber is not heated much. As described, if the processing of a lot requiring a small processing power is performed prior to the processing of a lot with a processing condition that heats the inner surface of the chamber greatly, it is preferable to heat the processing chamber in advance via a processing chamber surface temperature control step. Other than the fluctuation of processing power, the same phenomenon is sometimes caused by the fluctuation of magnetic field conditions or the like.

Figure 4:
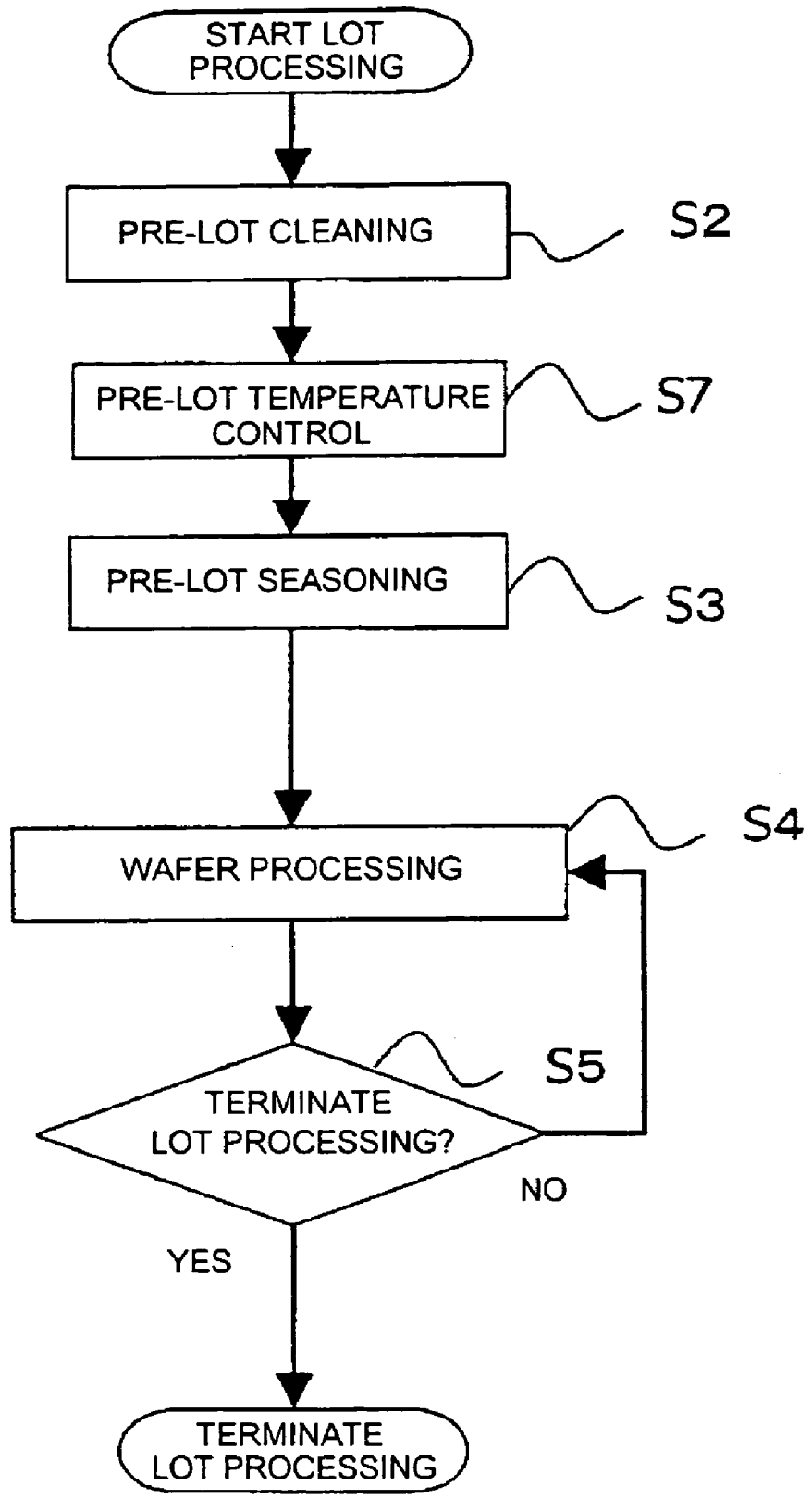
FIG. 4 is a diagram showing the continuous lot processing according to the present invention.
Figure 5:
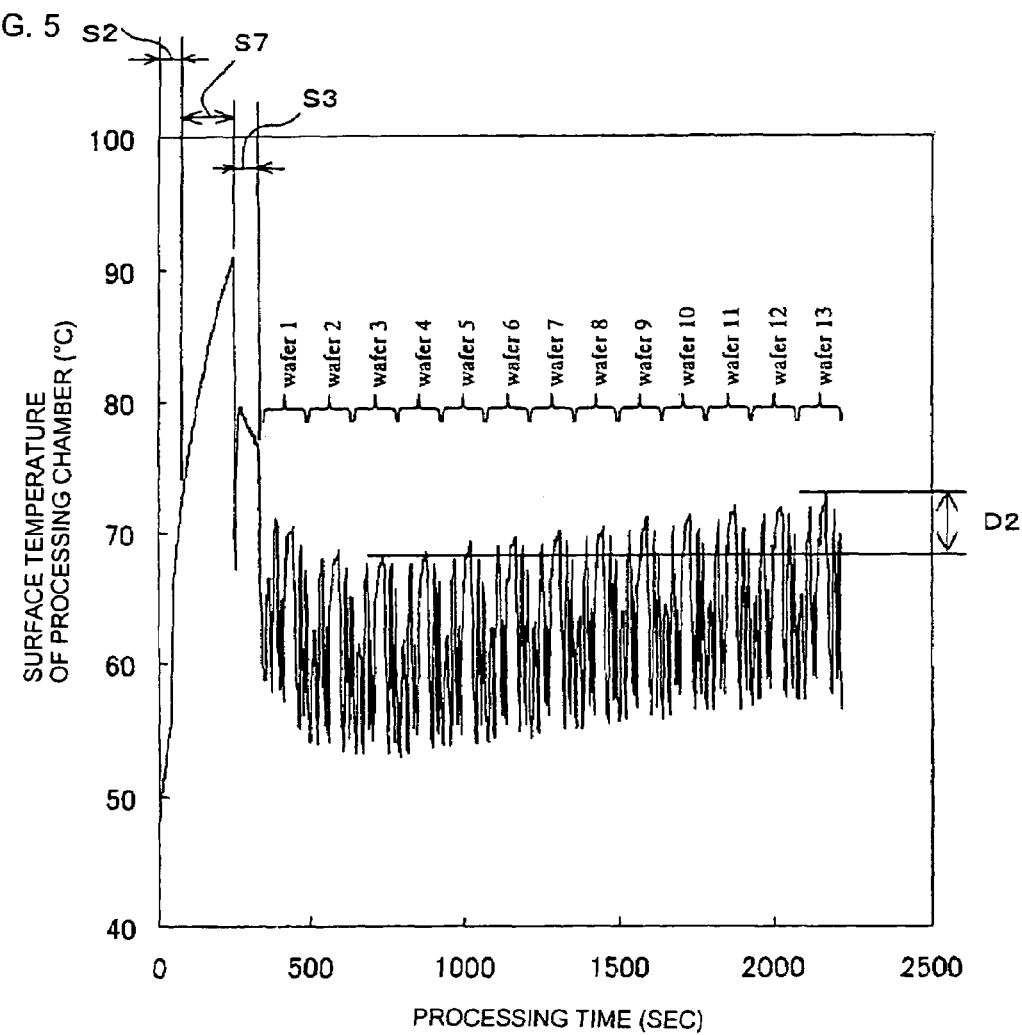
FIG. 5 is a chart showing an example of the change of inner surface temperature of the processing chamber.

FIG. 4 explains the continuous lot processing according to the present invention, and FIG. 5 illustrates an example of the change in inner surface temperature of the processing chamber when thirteen wafers are continuously processed according to the processing steps shown in FIG. 4 after allowing the processing chamber 1 to cool by leaving the chamber unused for approximately two hours. In FIG. 4, the same steps as those shown in FIG. 2 are denoted by the same reference numbers, and detailed descriptions thereof are omitted.

In the drawing, a pre-lot temperature control step S7 is for controlling the temperature of the inner surface of the processing chamber prior to wafer processing (step S4). By heating the inner surface of the pressure chamber as shown in FIG. 5, the range of the temperature drift during the processing of thirteen wafers can be reduced as shown by D2 of FIG. 5. The pre-lot temperature control step S7 in the example of FIG. 5 is performed continuously under the same processing conditions as the pre-lot cleaning performed directly prior to step S7. According to this example, the processing chamber is heated for a processing time of approximately 180 seconds.

Figure 6:
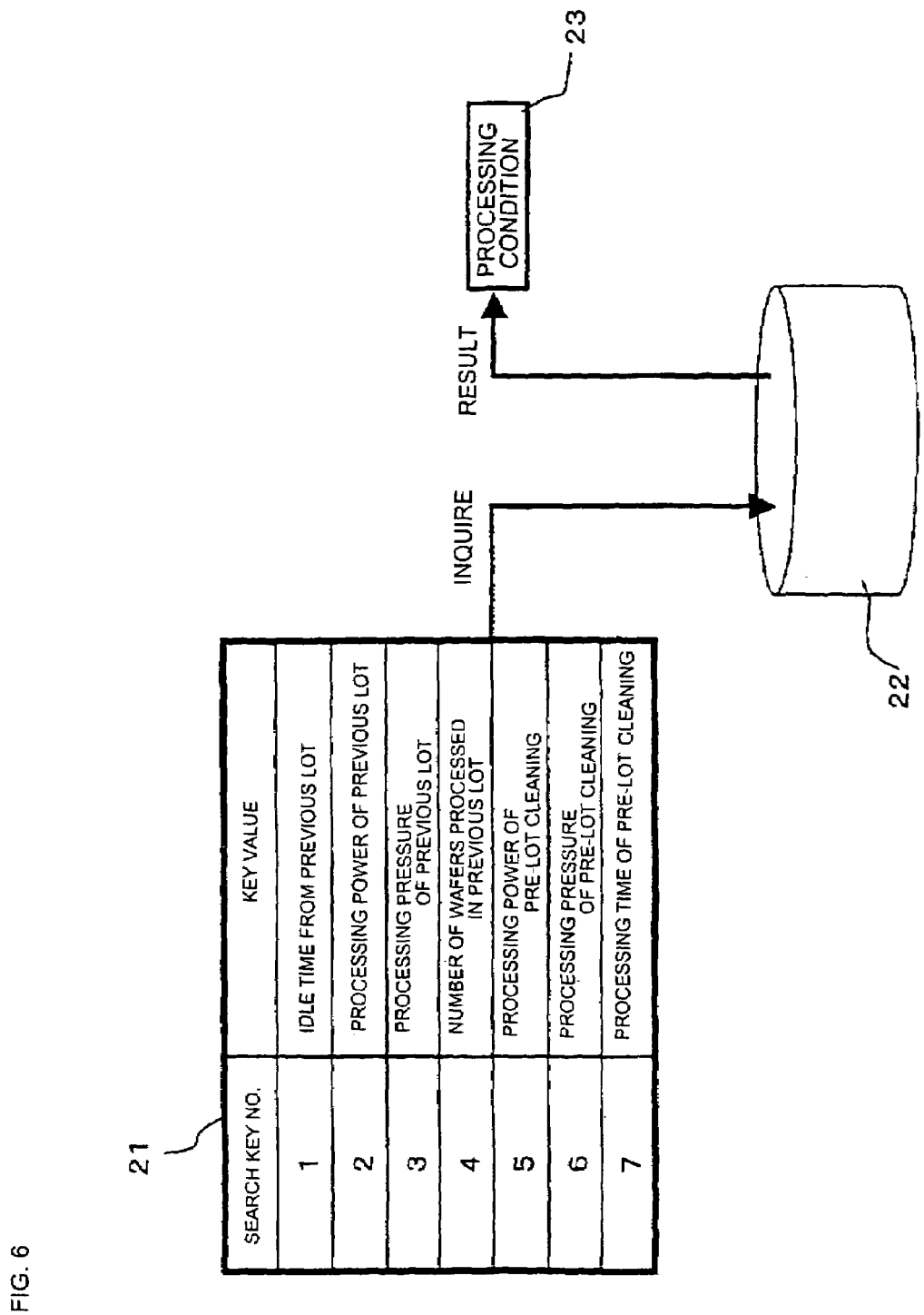
FIG. 6 is an explanatory view of the method for determining the processing conditions for a pre-lot temperature control step.

FIG. 6 is a view explaining the method for determining the processing conditions for pre-lot temperature control step S7. In the present invention, the processing conditions are determined based on the processing sequence as shown in FIG. 6, without detecting the surface temperature of the processing chamber by sensors etc. during wafer processing. It is difficult to measure the surface temperature of the processing chamber from outside, and if a temperature sensor etc. is installed inside the processing chamber, the sensor may be damaged by plasma and subjected to aging deterioration, or the sensor installed in the processing chamber may cause metal contamination of the wafers.

The important parameters for determining the processing conditions of the pre-lot temperature control step S7 are the processing time, the processing power, the processing pressure and the number of wafers being processed in the lot processed directly prior to the present lot, and based on these parameters, it is possible to estimate the rise of surface temperature of the processing chamber at the time the processing of the previous lot had been terminated. Based on this estimation, it is possible to estimate the surface temperature T0 at the time the previous lot processing had been terminated. If effective magnetic field plasma is performed, the magnetic field distribution is also an important parameter.

Next, it is possible to estimate a surface temperature T1 of the processing chamber at the time the current lot processing is to be started based on the idle time of the processing chamber from the time of termination of the previous lot processing. Thereafter, a surface temperature T2 of the processing chamber when starting the pre-lot temperature control step S7 (when terminating the pre-lot cleaning step S2) can be estimated based on the processing power, the processing pressure, the processing time and so on of the pre-lot cleaning step S2. If it is estimated that the surface temperature of the processing chamber is higher than the set value at the time the pre-lot cleaning S2 is terminated, the pre-lot temperature control step S7 carries out a cooling process of the processing chamber surface by allowing the processing chamber to rest with the plasma turned off. If the temperature drift as illustrated in FIG. 5 becomes a problem, a mechanism for cooling the processing chamber may be adopted so as to cool the processing chamber gradually when a number of wafers have been processed continuously.

The processing conditions of the pre-lot temperature control step S7 can be determined based on a database 22 storing pre-lot temperature control processing conditions using the past processing conditions as search key 21 as shown in FIG. 6. The database 22 storing the pre-lot temperature control processing conditions can be created by inputting actual measurement values measured via sensors etc. disposed in the processing chamber by experiments carried out in advance. The database 22 can also be created by inputting the surface temperature of the processing chamber calculated in advance via numerical simulation.

Instead of using a database, it is also possible to use a formula, such as an experimental formula calculated via experiments or a model formula calculated via numerical simulation. The variables of these formulas are preferably the physical quantity values listed as the search key 21 of FIG. 6. The temperature control in the pre-lot temperature control step S7 can be carried out either by controlling the processing time while using a constant processing power or by controlling the processing power during a fixed processing time. When effective magnetic field plasma is used, the temperature control can also be carried out by controlling the magnetic field conditions.

It is further preferable to adjust the inner surface temperature of the processing chamber by combining the plural processing conditions so as to control the distribution of wall heating. Especially in the case of effective magnetic field plasma, the plasma distribution can be easily changed by varying the magnetic field conditions, so it is preferable to combine plural magnetic field conditions.

In the example of FIG. 5, during lot processing, the temperature fluctuation while processing the second through fifth wafers is greater than that of the sixth and subsequent wafers, and a drop in inner surface temperature of the processing chamber during the initial stage is observed. This is due to the heat capacity of the entire processing chamber. Even when the inner surface of the processing chamber is heated by plasma, the average temperature of the entire processing chamber heated by the heater is low, so initially, the surface temperature of the processing chamber drops by the heat applied to the surface of the chamber being conducted to the entire processing chamber.

Figure 7:
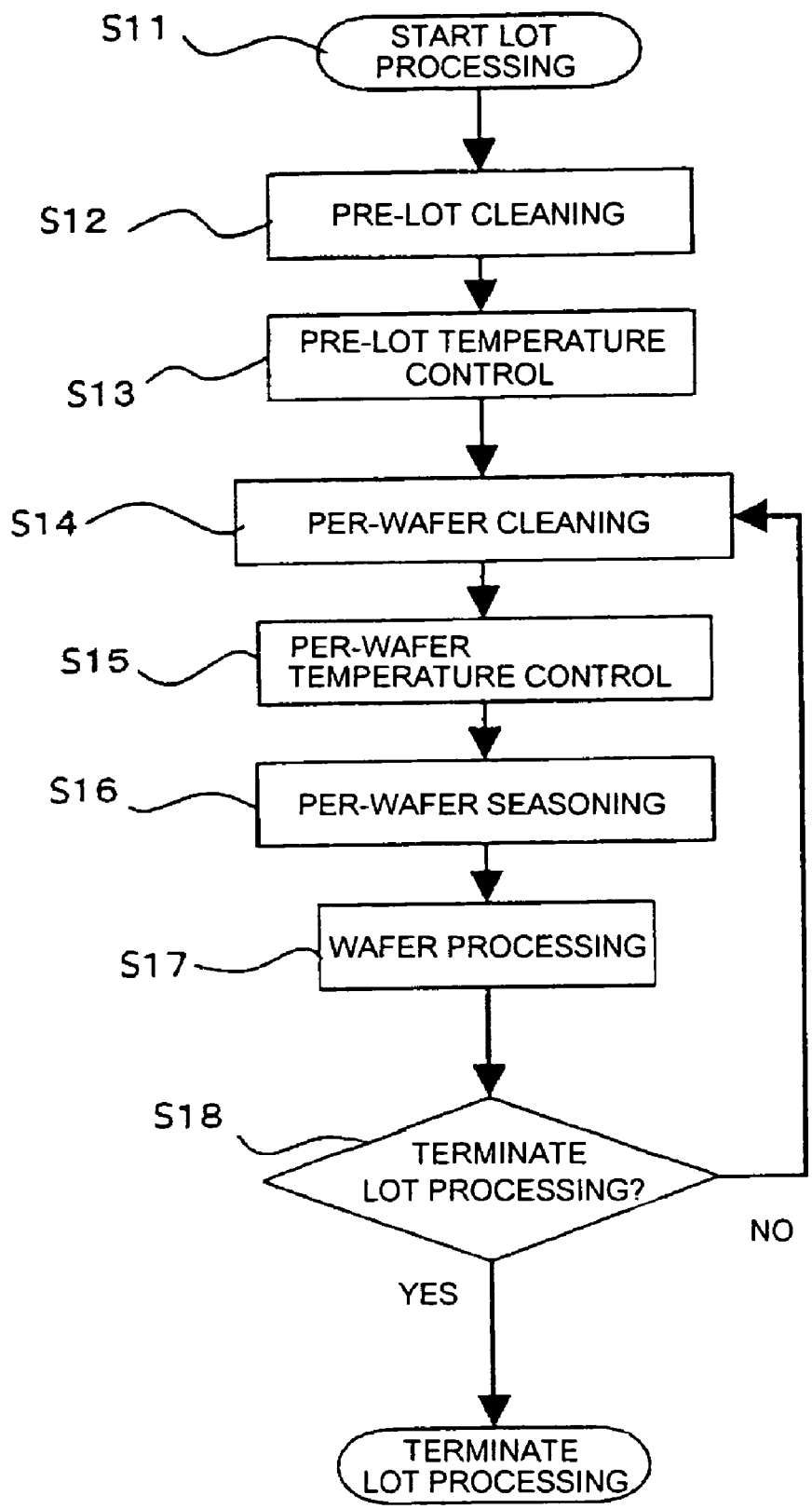
FIG. 7 is a diagram showing another example of the continuous lot processing according to the present invention.

FIG. 7 is a view explaining another example of continuous lot processing according to the present invention. Following step S11 for starting lot processing, a pre-lot cleaning step S12 for cleaning the processing chamber is carried out. The pre-lot cleaning step S12 can be omitted if the processing chamber is sufficiently cleaned via a per-wafer cleaning step S14 described later. However, the pre-lot cleaning step S12 is usually carried out while placing a dummy wafer on the sample stage, so it can be performed advantageously for a long period of time, for a few minutes to tens of minutes, without damaging the sample stage surface by plasma. Therefore, it is capable of performing cleaning more thoroughly than the per-wafer cleaning step S14 where cleaning is performed without placing the dummy wafer. Thus, even if step S12 can be omitted, it is preferable to perform step S12 once per several lots.

After terminating the pre-lot cleaning step S12, the pre-lot temperature control step S13 is executed, wherein the inner surface temperature of the processing chamber is adjusted for example by heating the chamber if it is cooled. If the currently processed lot is continuously processed after processing the previous lot, the pre-lot temperature control step S13 can be omitted to enhance the throughput of the apparatus.

Next, a per-wafer cleaning step S14 is performed. This step is for removing the deposits adhered to the chamber and electrodes during previous wafer processing, so it does not have to be performed before processing the first wafer. However, if the pre-lot cleaning step S12 is omitted as described earlier, it must be performed for processing the first wafer.

Next, the surface temperature of the processing chamber is adjusted again through a per-wafer temperature control step S15. This step is for correcting the inner surface temperature of the processing chamber to within a predetermined range for wafer processing if the temperature could not be controlled to fall within a predetermined fluctuation range in the pre-lot temperature control step S13 due to the thermal capacity of the processing chamber as shown in FIG. 5.

Thereafter, a per-wafer seasoning step S16 is carried out. This step aims at adapting the surface of the processing chamber to the etching gas and plasma used in the subsequent wafer processing step S17. Adapting the surface means modifying the surface of the processing chamber by what is called ion mixing in which ions are implanted on the surface having radicals from the plasma adhered thereto, whether the surface material of the processing chamber is quartz, alumina, ceramic or metal. For example, when halogenation gases such as Br or Cl gases are used as etching gas, the surface of the processing chamber is halogenated, and if hydrogen exists in the chamber, hydrogen is occluded on the chamber surface and the surface is adapted to the etching gas plasma. This per-wafer seasoning step S16 enables to suppress the radical fluctuation just after starting the subsequent wafer processing step S17, according to which stable processing profile is achieved. From the viewpoint of better throughput of the apparatus, the per-wafer seasoning step S16 is preferably performed without placing a wafer on the sample stage. However, sometimes the seasoning process is stabilized by the existence of silicon, so in that case, a dummy wafer can be placed on the sample stage.

Next, the wafer processing step S17 for continuously processing the wafers in a lot is carried out. The processes of steps S14 through S17 are repeated until the termination of wafer processing in a lot is detected in step S18.

Figure 8:
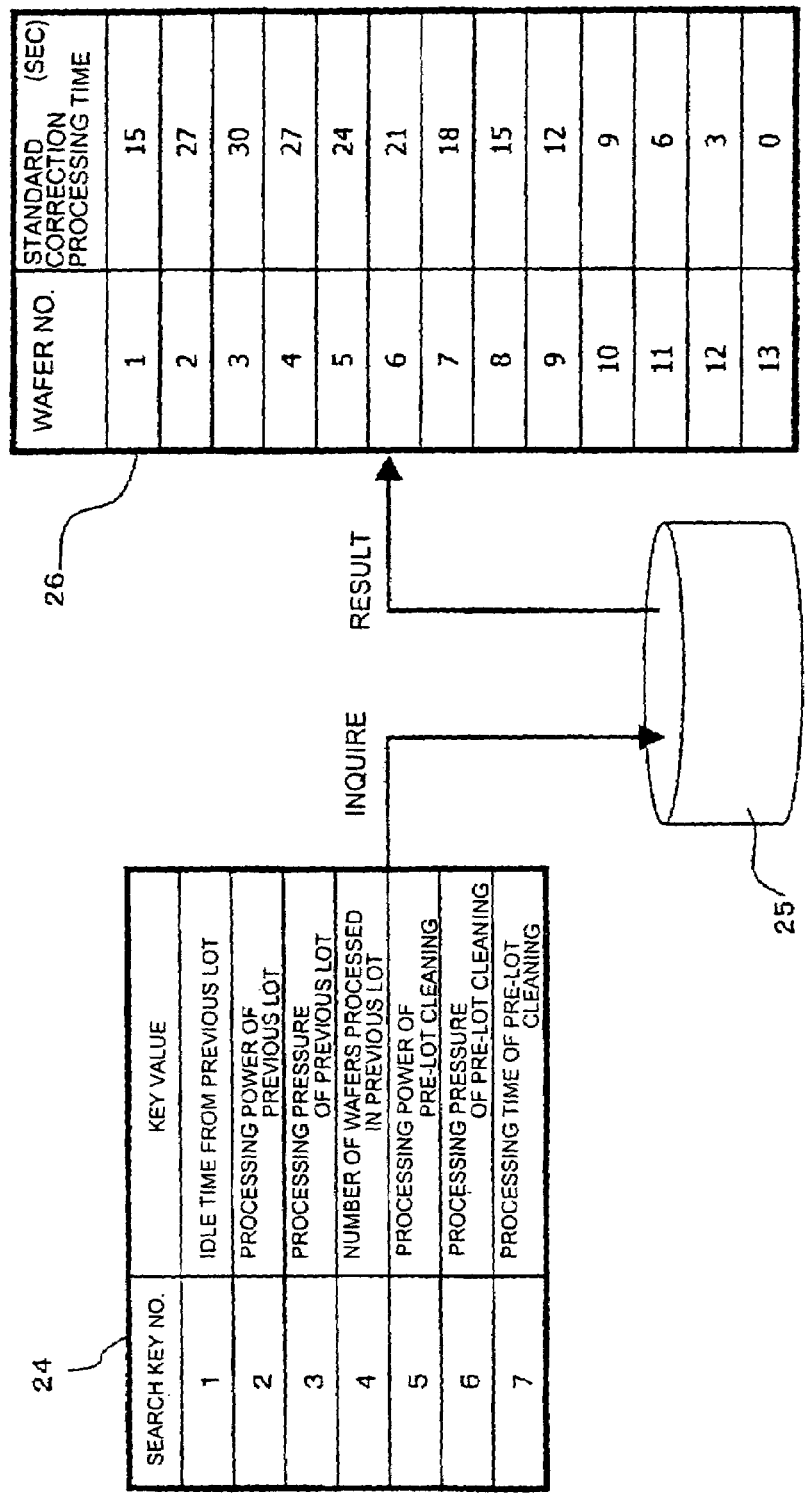
FIG. 8 is an explanatory view of the method for determining the processing conditions for the pre-lot temperature control step of FIG. 7.

FIG. 8 is a diagram explaining the method for determining the processing conditions for the pre-lot temperature control step S15 (per-wafer temperature control) in FIG. 7. The processing chamber surface temperature controlling unit 15 uses the past processing conditions as search key 24 as shown in FIG. 8 to make an inquiry with a database 25 storing per-wafer temperature control processing conditions, and retrieves a standard correction processing time per wafer. The database 25 storing per-wafer temperature control processing conditions can be created by actual measurement values measured via sensors etc. disposed in the processing chamber by an experiment carried out in advance. In stead of using a database, it is also possible to use a formula, such as an experimental formula obtained via experiments or a model formula obtained via numerical simulation.

When the lots are continuously processed and the processing chamber is not cooled, the standard correction processing time can be set to zero for all the wafers. Furthermore, when this standard correction processing time is either measured in advance via experiments or calculated via numerical simulation, it is desirable to determine the standard processing conditions for per-wafer cleaning, and if the processing time of the per-wafer cleaning step S14 becomes longer than the standard processing condition, the processing time of the per-wafer temperature control step S15 can be shortened accordingly.

Figure 9:
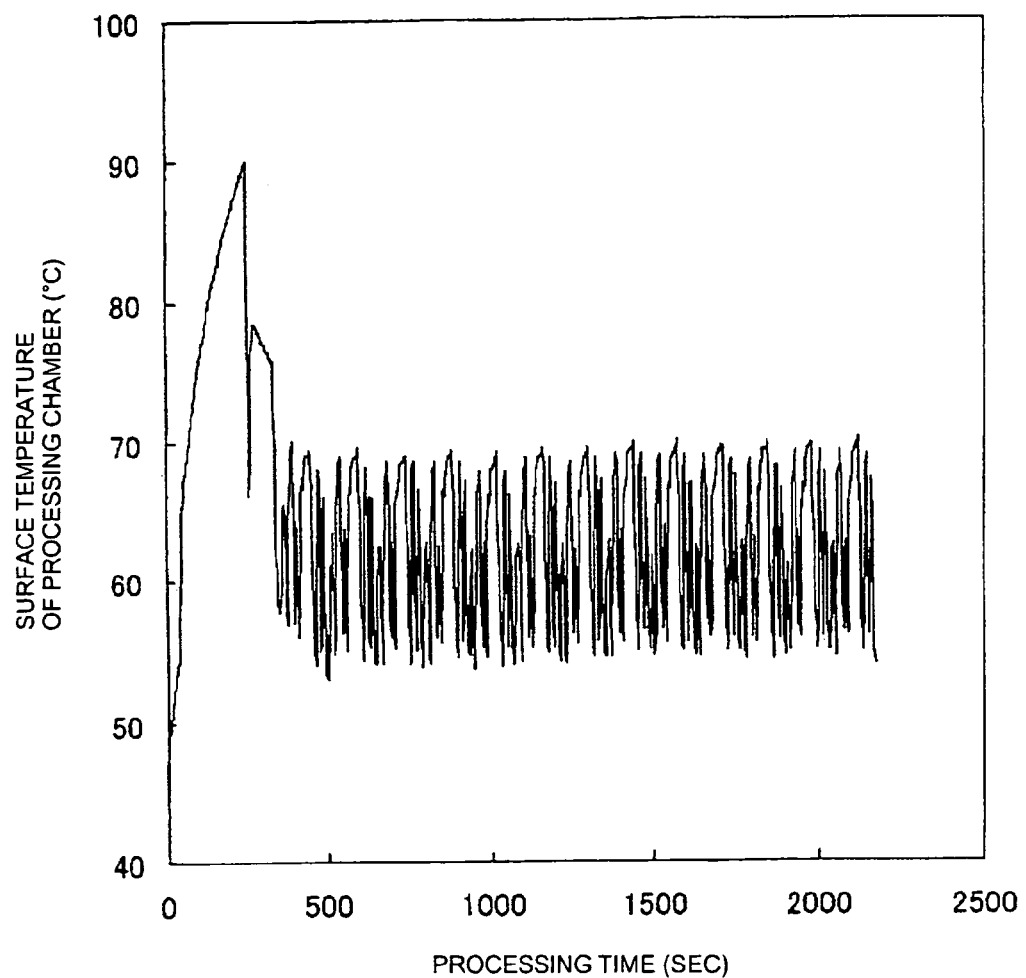
FIG. 9 is a chart showing an example of the change of inner surface temperature of the processing chamber.

FIG. 9 is a view showing an example of the change of inner surface temperature of the processing chamber that was observed when thirteen wafers were continuously processed according to the processing steps of FIG. 7 after allowing the processing chamber 1 to rest for approximately two hours to cool. According to the example shown in FIG. 9, the fluctuation of surface temperature of the processing chamber due to continuous lot processing can be substantially completely suppressed compared to the example shown in FIG. 5. Therefore, the variation of processing profile between wafers can be suppressed to a very small level.

Figure 10:
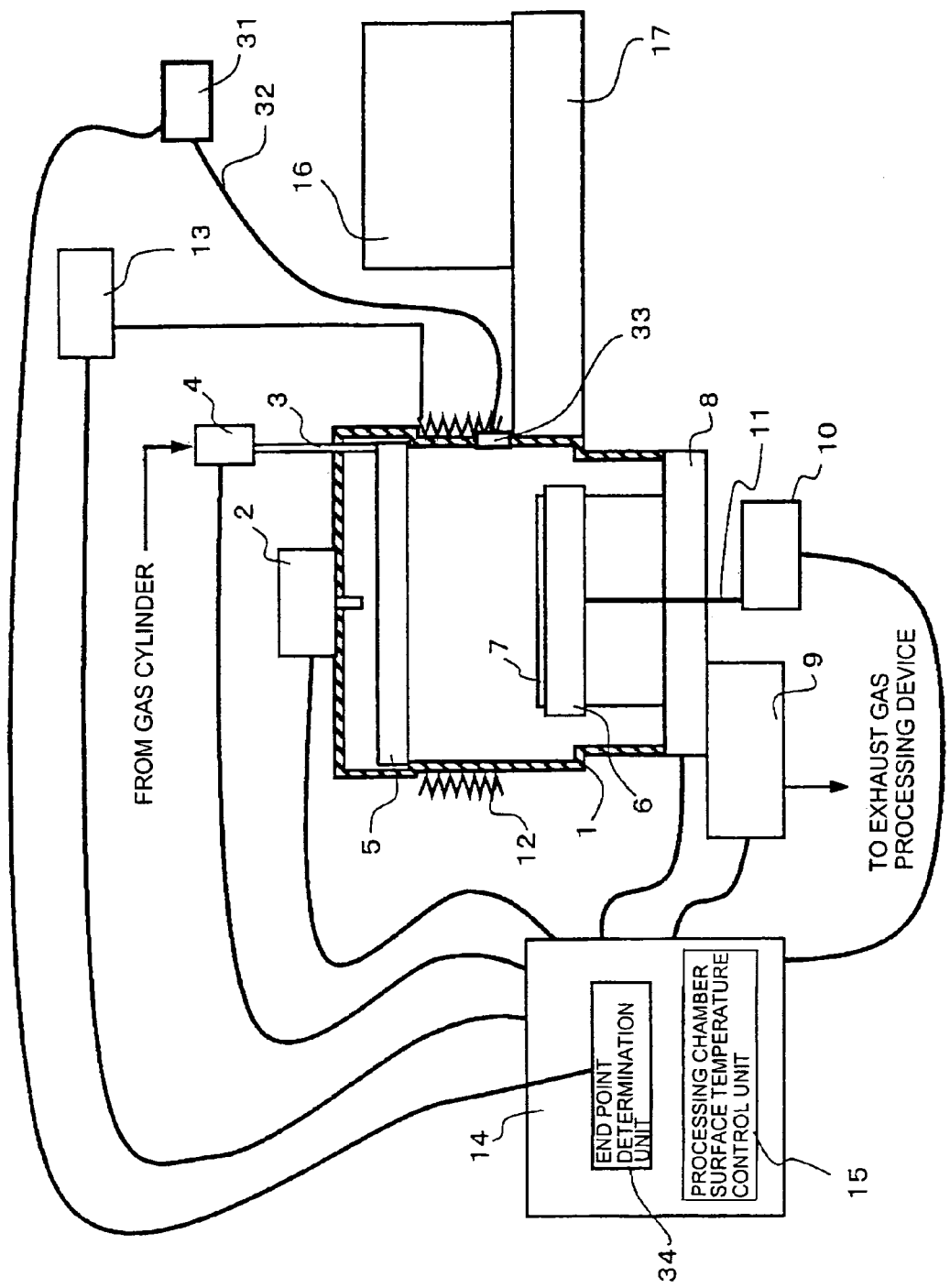
FIG. 10 is an explanatory view of the endpoint determination of the cleaning process or seasoning process.

FIG. 10 illustrates the end point determination of the cleaning process or the seasoning process. According to the example of FIG. 10, a spectroscope 31 for monitoring the plasma emission is used as the sensor for monitoring the state of plasma or radicals in the processing chamber. The plasma emission observed through an observation window 33 disposed to the processing chamber 1 is transmitted to the spectroscope 31 via an optical fiber 32, and is subjected to spectral decomposition in the spectroscope 31. Signals of spectral decomposition are transmitted to an end point determination unit 34 within the system control unit 14, where the end point of cleaning or seasoning is determined. In the plasma emission, the emission with a wavelength in the range of 200 nm to 400 nm is especially important to determine the end point of cleaning or seasoning. Thus, it is preferable to create the observation window 33 or the optical fiber 32 with quartz. If the window and fiber are made of glass or plastic, the light having a wavelength of 300 nm or smaller will be absorbed in glass etc. and cannot be observed. Further, other than observing the plasma emission, the state of plasma can also be observed through use of a sensor for detecting the electrical properties such as for measuring the bias voltage applied to the plasma.

The end point of cleaning such as pre-lot cleaning or per-wafer cleaning can be determined by monitoring the time change of emission spectral intensity of the products generated via etching reaction for removing the deposits on the inner wall of the processing chamber. For example, if a silicon wafer is used as the sample, the deposits include silicon. Therefore, it is preferable to monitor the peak of emission spectrum of silicon. Further, if the deposits are removed using chlorine-based gas such as $Cl_2$, it is preferable to monitor the time change of the peak of emission spectrum of silicon chlorides such as SiCl. Furthermore, if the deposits are removed using fluorine-based gas such as $SF_6$ or $CF_4$, it is preferable to monitor the time change of the peak of emission spectrum of silicon fluorides such as SiF.

Moreover, it is possible to monitor the emission spectral intensity of a radical so-called an etchant for removing the deposits on the inner wall of the processing chamber. The etchant is generated by the etching gas being activated by plasma. The density of the etchant is decreased during cleaning since it is consumed by the reaction with the deposits. However, when the cleaning is terminated, the deposits are removed and the etchant is no longer consumed. Therefore, the density of etchant in the processing chamber rises and saturates. The density and the emission intensity of etchant are closely related. Therefore, the end point of cleaning can be determined by monitoring the emission intensity of the etchant.

Figure 11:
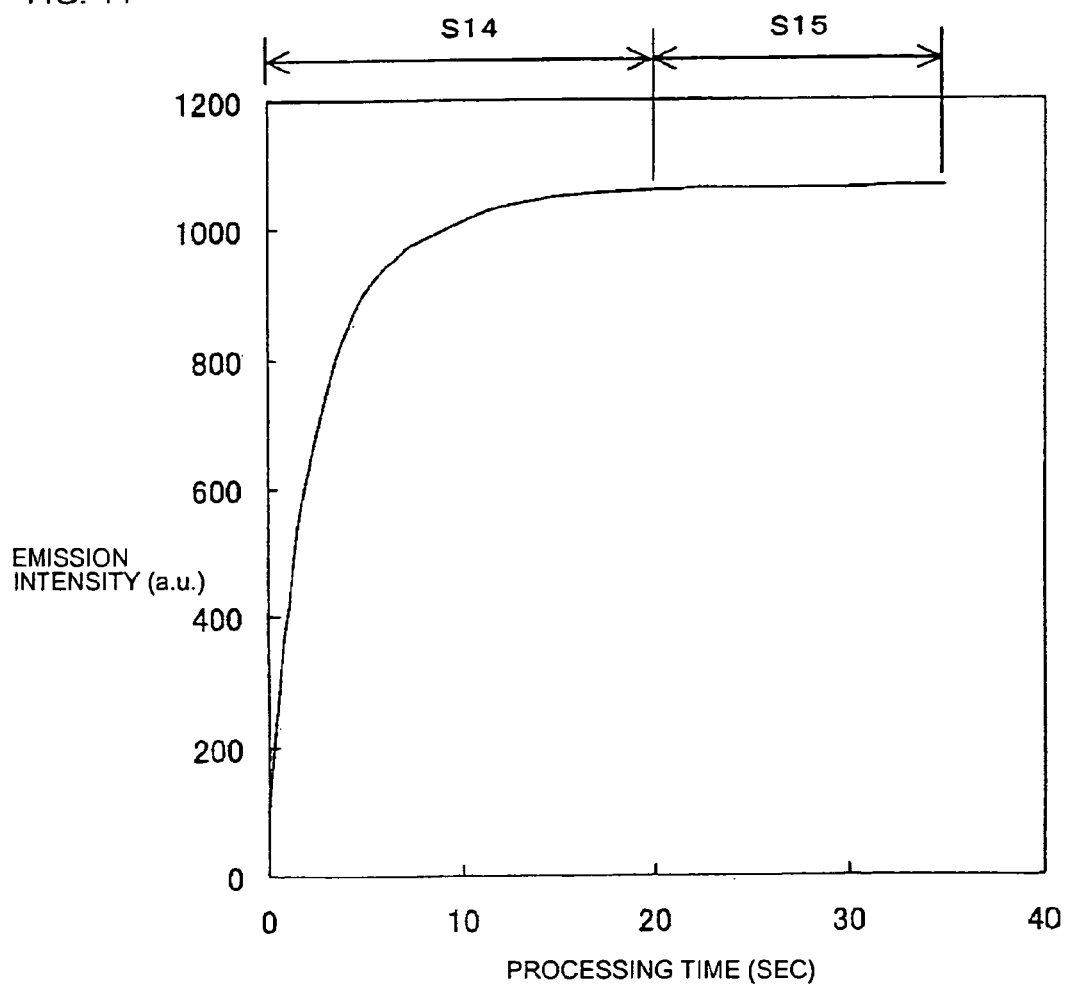
FIG. 11 is a chart showing the end point determination of a per-wafer cleaning process performed based on emission spectral intensity.

FIG. 11 is an explanatory chart of the endpoint determination of the per-wafer cleaning process performed based on the emission spectral intensity. This chart illustrates an example recording the change of emission spectral intensity of fluorine radicals when silicon-based deposits are cleaned with fluorine-based gas. The change of emission spectral intensity of fluorine radicals stops after approximately 20 seconds from the start of the cleaning process step S14, and so it is possible to determine that the cleaning process has terminated at this point. The per-wafer temperature control step S15 is carried out for 15 seconds starting from this point, under the same conditions as the per-wafer processing. The end point of the seasoning process can also be determined in a similar manner. In order to determine the termination of the seasoning process, it is necessary to determine that the states of many radicals have become equal. Therefore, it is preferable to extract the change of emission spectrum via principal component analysis or other multivariate analysis and to determine the end point from the variation of the signals being extracted.

Figure 12:
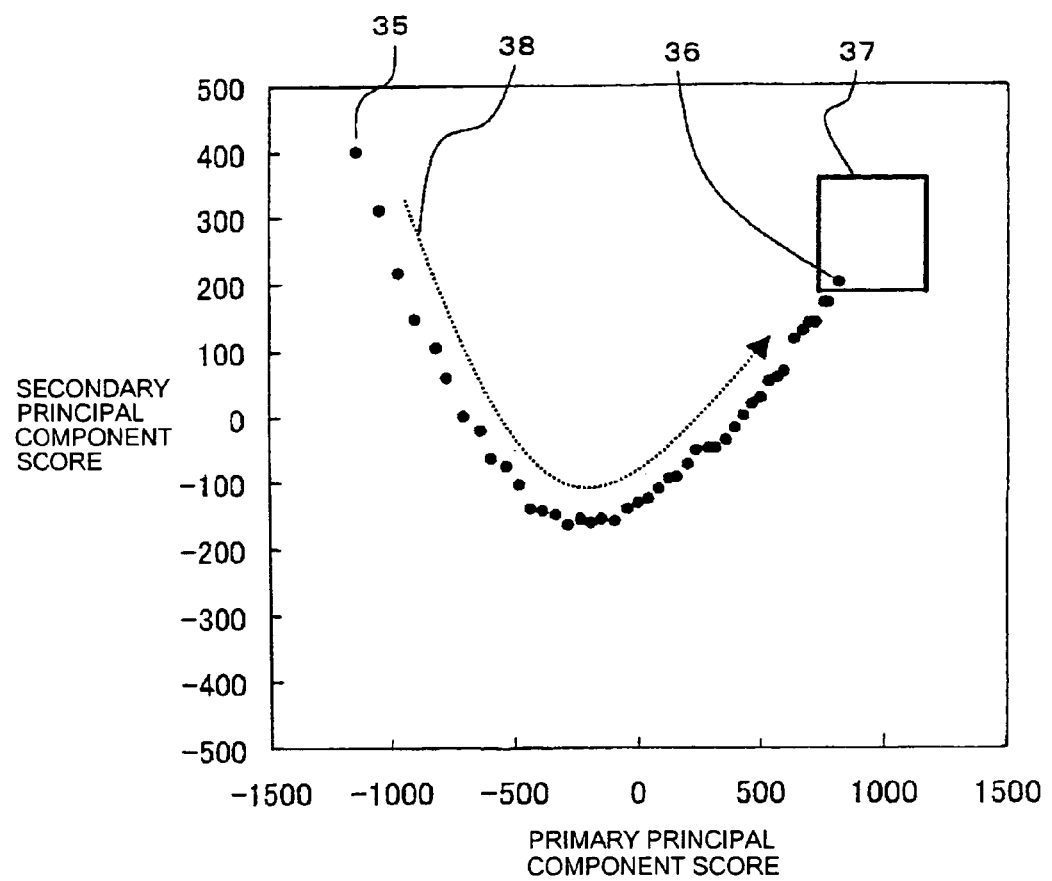
FIG. 12 is a chart showing an example of how the end point of seasoning is determined based on principal component analysis.

FIG. 12 is a chart showing an example of how the end point of seasoning is determined using principal component analysis. Principal component analysis is a statistical method for binding the fluctuation of a large number of variables based on correlations in order to compress the variables into a small number of variables called principal component scores. The principal component scores obtained by compressing the emission spectrum via principal component analysis can be used as parameters representing the radical variation of plasma. FIG. 12 is a graph showing the result of the principal component analysis of emission spectral fluctuation performed during the seasoning step, wherein the horizontal axis represents the primary principal component score and the vertical axis represents the secondary principal component score. As shown in the graph of FIG. 12, the state of the emission spectrum is gradually varied from a seasoning start point 35 toward the direction of evolution (direction shown by arrow 38), and finally, when it enters a seasoning termination determination zone 37, that point is determined as the seasoning end point 36 and the seasoning is terminated. By controlling the process so that the pair of principal component scores obtained from the emission spectrum enters the seasoning termination determination zone 37, the state of the plasma or the radicals in the processing chamber can be maintained constant. It is desirable to adjust the range of the seasoning termination determination zone 37 according to the process accuracy required for the processed semiconductor device. Generally, if a high level of process accuracy is required, the termination determination zone is set narrower. According to the present example, the determination was performed in a two-dimensional plane using the primary and secondary principal component scores, but it is also possible to determine the termination of the seasoning step in multidimensional space using more principal components.

Figure 13:
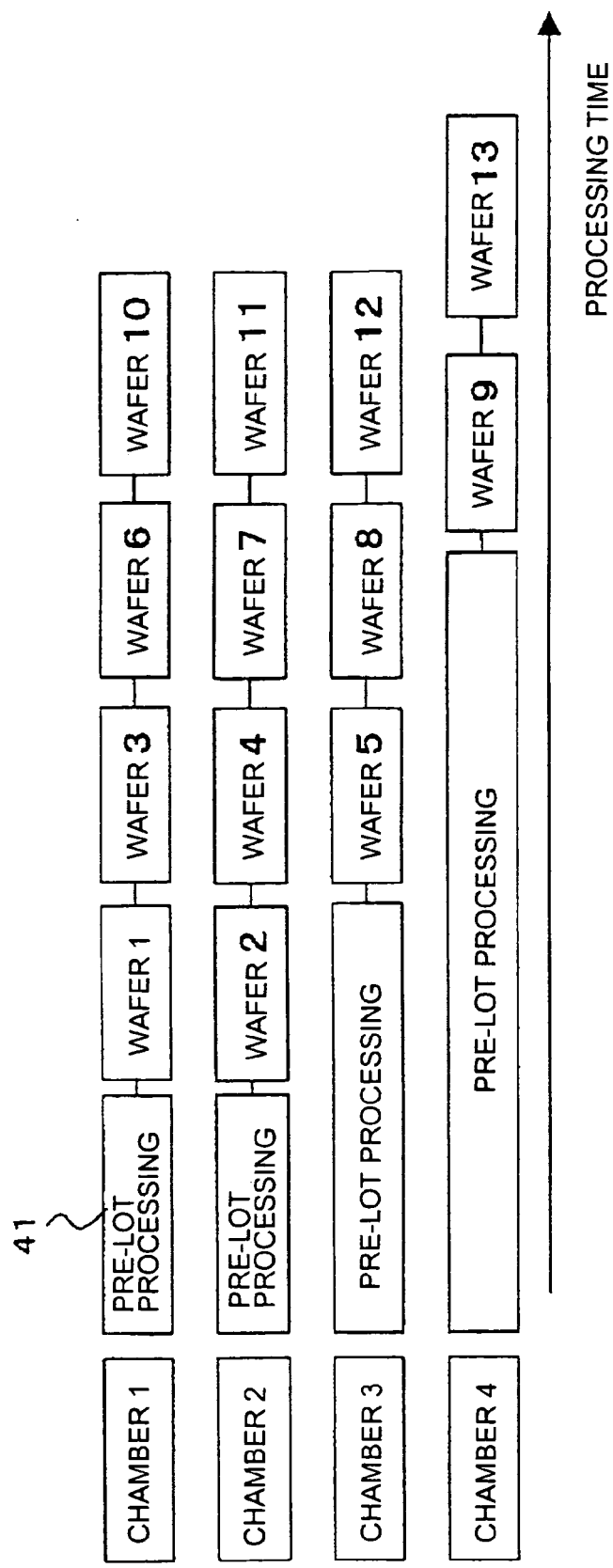
FIG. 13 is an explanatory view showing an example of how the present invention is applied to a plasma processing apparatus having plural processing chambers.

FIG. 13 illustrates an example of how the present invention is applied to a plasma processing apparatus having plural processing chambers.

In a plasma processing apparatus having plural processing chambers, each of the plural processing chambers is usually used to process a separate lot. In this case, the processing history of each processing chamber differs, and the inner surface temperature of each chamber also differs. Thus, the processing profile will vary among the processing chambers. Therefore, even if the plasma processing apparatus having plural processing chambers is equipped with a function to enhance throughput by carrying out distributed processing of a single lot of wafers in plural processing chambers, it is not possible to perform distributed processing if the processing profile differs per processing chamber.

According to the example shown in FIG. 13, upon starting lot processing, the pre-lot processing 41 including the pre-lot cleaning step S12 and the pre-lot temperature control step S13 is applied. As shown in FIG. 12, the wafer processing is performed sequentially in the plural processing chambers, in the order starting from the chamber having completed the pre-lot processing 41 and ready to perform processing. Thus, the plural processing chambers can be used simultaneously for processing a single lot of wafers without deteriorating the quality of the processing profile, and the throughput of the apparatus can thereby be improved.

The embodiments of the present invention have been described taking a semiconductor device as an example of the object to be processed, but other samples, such as LCD devices, can also be the object to be processed.

As have been described, each embodiment of the present invention is equipped with a processing chamber surface temperature control unit, and through use of this control unit, enables to maintain the inner surface temperature of the processing chamber within a predetermined range based on past processing conditions. Thus, the present invention enables to suppress the fluctuation of the processing profile of the processed objects. Moreover, by adopting a sensor and an end point determination unit for determining the end point of the cleaning process or seasoning process, the present invention enables to remove the deposits in the processing chamber and adjust the inner surface temperature of the chamber by determining the end point of the cleaning process, and the present invention enables to appropriately adapt the inner surface of the processing chamber to the plasma of the etching gas by determining the end point of the seasoning process. According further to the present invention, the state of radicals can be made constant during wafer processing so as to suppress the fluctuation of processing profile of the processed objects.

What is claimed is:

1. A plasma processing apparatus for providing a plasma processing to a wafer transferred into a vacuum processing vessel, the apparatus comprising:
   a vacuum processing vessel constituting a vacuum processing chamber;
   a processing gas supply unit for supplying a processing gas to the vacuum processing vessel;
   a plasma generating means for generating plasma by supplying electromagnetic energy to the vacuum processing vessel and dissociating the processing gas supplied to the processing chamber; and
   a processing chamber surface temperature control unit for controlling the inner surface temperature of the vacuum processing chamber, wherein the control unit controls the inner surface temperature by generating plasma in the processing chamber under processing conditions set in advance according to a processing history and heating the inner surface of the processing chamber prior to performing the wafer processing.

2. The plasma processing apparatus according to claim 1, wherein
   the heating process for heating the inner surface of the processing chamber is carried out for every lot of wafers to be processed.

3. The plasma processing apparatus according to claim 1, wherein
   the heating process for heating the inner surface of the processing chamber is carried out for every wafer to be processed.

4. The plasma processing apparatus according to claim 1, wherein
   heating time is estimated based on processing conditions of a lot processing of wafers carried out immediately prior to the processing to be performed.

5. The plasma processing apparatus according to claim 4, wherein
   the processing conditions include at least one of the following: an idle time from the termination of an immediately previous lot processing, a processing time, a processing power, a processing pressure, a number of wafers being processed or a state of magnetic field distribution of the immediately previous lot processing.

6. The plasma processing apparatus according to claim 1, wherein
   termination of a cleaning process is detected based on a spectral intensity of plasma emission.

7. The plasma processing apparatus according to any one of claims 1 through 6, wherein
   the plasma processing apparatus comprises plural processing chambers, and the wafers stored in a cassette are subjected to continuous processing in the plural processing chambers.

8. The plasma processing apparatus according to claim 1, wherein
   the apparatus is equipped with a mechanism for cooling the vacuum processing vessel.

9. The plasma processing apparatus according to claim 1, wherein the control unit controls the inner surface temperature of at least a sidewall of the vacuum processing chamber by at least generating plasma in the processing chamber prior to performing the wafer processing so as to heat the inner surface of at least the sidewall of the processing chamber prior to performing the wafer processing.

10. A plasma processing method comprising:
    supplying electromagnetic energy to a vacuum processing vessel;
    dissociating a processing gas supplied to a processing chamber so as to generate plasma; and
    providing using the generated plasma a plasma processing to a wafer transferred into the vacuum processing vessel;

wherein prior to the wafer processing, plasma is generated in the processing chamber during a processing time set in advance according to a processing history so as to heat an inner surface of the processing chamber and control the inner surface temperature of the processing chamber.

11. The plasma processing method according to claim 10, wherein
the heating of the inner surface of the processing chamber by plasma is carried out for every lot of wafers to be processed.

12. The plasma processing method according to claim 10, wherein
the heating of the inner surface of the processing chamber by plasma is carried out for every wafer to be processed.

13. The plasma processing method according to claim 10, wherein
processing time for heating the inner surface of the processing chamber by plasma is estimated based on processing conditions of a lot processing of wafers carried out immediately prior to the processing to be performed.

14. The plasma processing method according to any one of claims 10 through 13, further comprising cooling the vacuum processing vessel.

15. The plasma processing method according to claim 10, wherein a chamber cleaning process is run after the heating process and the termination of the cleaning process is detected based on a spectral intensity of plasma emission.

16. The plasma processing method according to claim 10, wherein plasma is generated in the processing chamber prior to the wafer processing so as to heat the inner surface of at least a sidewall of the processing chamber and control the inner surface temperature of at least the sidewall of the processing chamber prior to the wafer processing.

* * * * *

UNITED STATES PATENT AND TRADEMARK OFFICE
CERTIFICATE OF CORRECTION

PATENT NO. : 6,939,435 B1 Page 1 of 1
DATED : September 6, 2005
INVENTOR(S) : Tanaka et al.

It is certified that error appears in the above-identified patent and that said Letters Patent is hereby corrected as shown below:

Title page,
Item [56], References Cited, FOREIGN PATENT DOCUMENTS,
"WO 01/45490    6/2001" should read
-- WO 01/46490    6/2001 --.

Signed and Sealed this

Third Day of January, 2006

JON W. DUDAS
*Director of the United States Patent and Trademark Office*